United States Patent
Wimpenny

(10) Patent No.: US 9,480,160 B2
(45) Date of Patent: Oct. 25, 2016

(54) ENVELOPE TRACKING POWER AMPLIFIER WITH LOW IMPEDANCE SUPPLY FEED

(71) Applicant: SnapTrack, Inc., San Diego, CA (US)

(72) Inventor: Gerard Wimpenny, Cambridgeshire (GB)

(73) Assignee: QUALCOMM Incorporated, San Diego, CA (US)

( * ) Notice: Subject to any disclaimer, the term of this patent is extended or adjusted under 35 U.S.C. 154(b) by 10 days.

(21) Appl. No.: 14/350,702

(22) PCT Filed: Oct. 9, 2012

(86) PCT No.: PCT/EP2012/069973
§ 371 (c)(1),
(2) Date: Apr. 9, 2014

(87) PCT Pub. No.: WO2013/053713
PCT Pub. Date: Apr. 18, 2013

(65) Prior Publication Data
US 2015/0014041 A1  Jan. 15, 2015

(30) Foreign Application Priority Data
Oct. 10, 2011 (GB) .................... 1117436.4

(51) Int. Cl.
| | | |
|---|---|---|
| H03G 3/20 | (2006.01) |
| H05K 1/18 | (2006.01) |
| H03F 1/02 | (2006.01) |
| H03H 7/01 | (2006.01) |

(52) U.S. Cl.
CPC ............. H05K 1/18 (2013.01); H03F 1/0211 (2013.01); H03F 1/0227 (2013.01); H03G 3/20 (2013.01); H03H 7/0115 (2013.01)

(58) Field of Classification Search
CPC .......... H03F 1/56; H03F 1/02; H03F 1/0222; H03F 3/68; H03G 3/20
USPC ....... 330/127, 297, 306, 129, 133–134, 279, 330/285, 124 R; 455/127.1, 333–334, 552.1
See application file for complete search history.

(56) References Cited

U.S. PATENT DOCUMENTS 4,963,833 A * 10/1990 Mountz .................... H05K 7/20
330/289
7,428,136 B2  9/2008 Barnett
(Continued)

FOREIGN PATENT DOCUMENTS

| CN | 1135811 A | 11/1996 |
| EP | 2293433 A1 | 3/2011 |

(Continued)

OTHER PUBLICATIONS

Officer: Werner Kurzbauer, "Related International Application No. PCT/EP2012/069973", "International Preliminary Report on Patentability", Apr. 24, 2014, Publisher: PCT / ISA, Published in: EP.
(Continued)

*Primary Examiner* — Steven J Mottola
*Assistant Examiner* — Hafizur Rahman

(57) ABSTRACT

There is disclosed a supply feed network for an envelope tracking power amplifier arrangement comprising a power amplifier and a voltage modulator for providing a supply voltage to the power amplifier, the supply feed network comprising: a power distribution plane arranged to connect the supply voltage from the voltage modulator to the power amplifier.

10 Claims, 8 Drawing Sheets

(56) References Cited

U.S. PATENT DOCUMENTS

| | | |
|---|---|---|
| 2006/0221585 A1 | 10/2006 | Brench |
| 2010/0210318 A1* | 8/2010 | Zhu .................. H01M 10/4257 455/572 |
| 2011/0018628 A1 | 1/2011 | Yang et al. |

FOREIGN PATENT DOCUMENTS

| | | | | |
|---|---|---|---|---|
| FR | 2383552 A1 | 10/1978 | | |
| GB | 2 411 062 A | * 8/2005 | ................ | H03F 1/32 |
| GB | 2411062 A | * 8/2005 | ................ | H03F 1/02 |
| GB | 2480687 A | 11/2011 | | |
| WO | 2010115465 A1 | 10/2010 | | |
| WO | 2011049997 A1 | 4/2011 | | |

OTHER PUBLICATIONS

"Parent GB Patent Application No. GB 1117436.4 Search Report", Jan. 31, 2012, Publisher: UK IPO, Published in: GB.

Officer: Werner Kurzbauer, "Related International Application No. PCT/EP2012/069973", "International Search Report & Written Opinion", Apr. 4, 2013, Publisher: PCT, Published in: EP.

* cited by examiner a)

b)

ENVELOPE TRACKING POWER AMPLIFIER WITH LOW IMPEDANCE SUPPLY FEED

BACKGROUND TO THE INVENTION

1. Field of the Invention

The invention relates to envelope tracking (ET) radio frequency (RF) power amplifiers.

2. Description of the Related Art

Power amplifier systems incorporating envelope tracking power supplies are known in the art. Envelope tracking may be applied to radio frequency (RF) transmitters operating across a wide range of RF frequencies, from HF (high frequency) to microwave.

In an envelope tracking RF power amplifier system, the supply voltage fed to the power amplifier is adjusted dynamically to track the envelope of the RF input signal being amplified at high instantaneous RF powers. Generating the supply voltage by tracking the signal being amplified improves efficiency of operation by providing only the necessary supply voltage to amplify the instantaneous input signal. An 'ideal' supply voltage instantaneously tracks the instantaneous RF input power signal such that at any instant a sufficient and only a sufficient level of voltage supply is provided.

At high instantaneous RF input powers the power amplifier operates in compression and the RF output power is determined by the supply voltage rather the RF input power. This may be termed a compressed mode of operation. At low instantaneous RF input powers the supply voltage is held substantially constant at some minimum value appropriate for the power amplifier device technology. This may be termed a linear mode of operation. In the linear mode of operation the RF output power is predominantly determined by the RF input power. At medium instantaneous RF power there is a gradual transition between the compressed and linear modes of operation.

The modes of operation of the power amplifier are illustrated in FIG. 1. FIG. 1 illustrates a plot 8 of instantaneous supply voltage for the power amplifier against instantaneous RF input power to the power amplifier. The linear mode of operation takes place in a linear region denoted by reference numeral 2. The compressed mode of operation takes place in a compressed region denoted by reference numeral 6. The transition between these two modes of operation takes place in a transition region 4.

From the above it is apparent that when the power amplifier is operating in the compressed or transition regions of operation any error between the applied supply voltage and the 'ideal' desired supply voltage will result in an error in the instantaneous RF output power of the signal at the output of the power amplifier. The error in the output power, in turn, degrades the linearity of the transmitted signal resulting in increased error vector magnitude, EVM, a measure of in-band distortion; adjacent channel leakage ratio (ACLR) distortion (close to carrier distortion); and for frequency division duplex (FDD) systems, receive band noise (far from carrier distortion).

An 'ideal' envelope tracking power supply (also known as an envelope amplifier or an envelope modulator) may be modelled as a modulated voltage source which is connected to the drain or collector of a power amplifier transistor via a feed network.

For an envelope tracking power amplifier it is important to achieve low supply impedance at all frequencies at which supply current is drawn including video frequencies, as the final power amplifier stage operates in compression over a large range of the modulation cycle (unlike fixed supply power amplifiers), and hence the conversion gain from supply noise to RF sidebands is higher.

In a practical implementation a physical interconnection between the modulator and the power amplifier is required, which introduces series inductance in the supply feed. The error in the supply feed results in the power amplifier exhibiting 'memory effect'.

SUMMARY OF THE INVENTION

There is provided a supply feed network for an envelope tracking power amplifier arrangement comprising a power amplifier and a voltage modulator for providing a supply voltage to the power amplifier, the supply feed network comprising: a power distribution plane arranged to connect the supply voltage from the voltage modulator to the power amplifier.

The supply feed network may further comprise an inductor, wherein the power distribution plane is connected to one side of the inductor and the power transistor is connected to another side of the inductor such that the supply voltage is provided to the power amplifier via the power distribution plane and the inductor, wherein the capacitance of the power transistor forms a resonant circuit with the inductor.

The supply feed network may further comprise a transmission line, wherein the power distribution plane is connected to one side of the transmission line and the power transistor is connected to another side of the transmission line such that the supply voltage is provided to the power amplifier via the power distribution plane and the transmission line. The power distribution plane may be arranged to provide the transmission line.

The envelope tracking power amplifier may be a radio frequency, RF, power amplifier for amplifying an RF carrier signal, the supply feed network further comprising an RF de-coupling capacitor connected between the power distribution plane and electrical ground.

The supply feed network may be further adapted to connect the supply voltage from the voltage modulator to a plurality of power amplifiers.

The supply feed network may further comprise a plurality of inductors, wherein the power distribution plane is connected to one side of the inductor and each power transistor is connected to another side of the inductor such that the supply voltage is provided to the power amplifier via the power distribution plane and the inductors, wherein the capacitance of each power transistor forms a resonant circuit with each inductor.

The supply feed network may further comprise a plurality of transmission lines, wherein the power distribution plane is connected to one side of each transmission line and the power transistors are connected to another side of each respective transmission line such that the supply voltage is provided to the power amplifier via the power distribution plane and the respective transmission lines.

The power distribution plane may be arranged to provide each of the transmission lines.

The envelope tracking power amplifiers may be radio frequency, RF, power amplifiers for amplifying an RF carrier signal, the supply feed network further comprising a plurality of RF de-coupling capacitors each associated with a respective power amplifier and connected between the power distribution plane and electrical ground.

The frequency at which a minimum impedance resonance occurs in the impedance presented to the voltage modulator by the power amplifier may be increased, thereby allowing an increase in the stable bandwidth of the voltage modulator.

BRIEF DESCRIPTION OF THE FIGURES

The invention is now described by way of example with reference to the accompanying figures in which.

DESCRIPTION OF THE PREFERRED EMBODIMENTS

The invention is described in the following with regard to embodiments illustrating an envelope tracking RF power amplifier.

Figure 1:
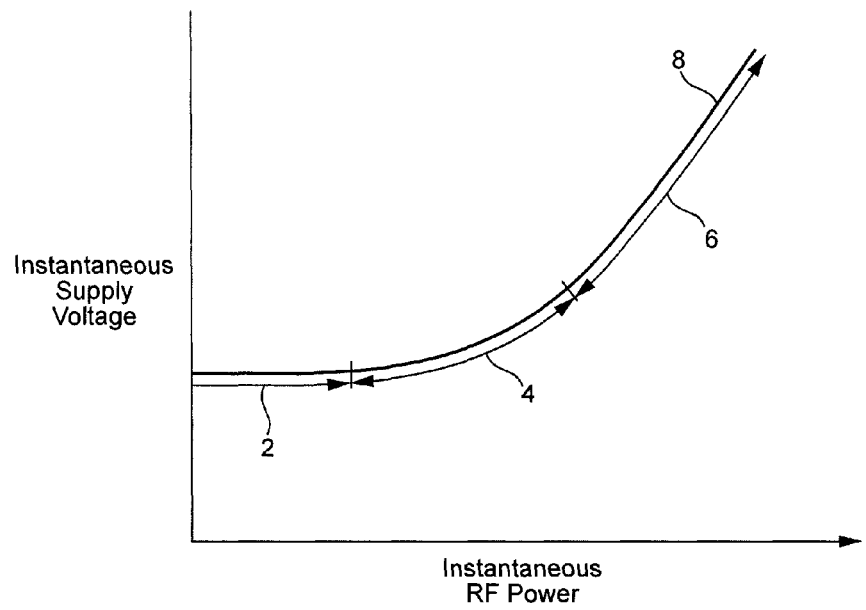
FIG. 1 illustrates the operating regions on an exemplary RF power amplifier.
Figure 2:
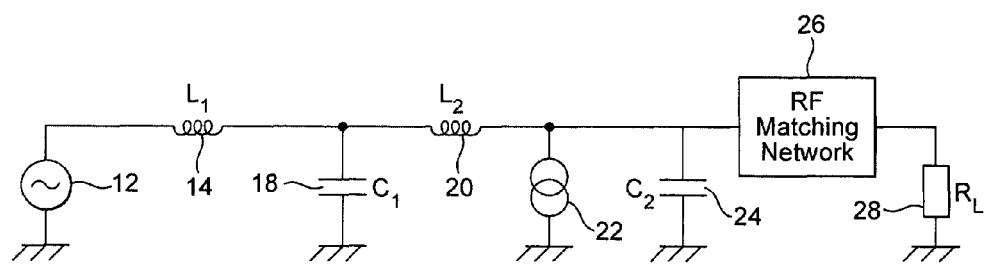
FIG. 2 illustrates a model of an exemplary envelope tracking power supply and power amplifier.

An exemplary model of a supply feed network of an envelope tracking power supply is illustrated in FIG. 2.

An ideal voltage modulator 12 is connected between electrical ground and a first terminal of an inductor 14. A second terminal of inductor 14 is connected to a first terminal of an inductor 20. A capacitor 18 has a first terminal connected to electrical ground and a second terminal connected to the second terminal of the inductor 14 and the first terminal of the inductor 20. An ideal RF transistor is represented by a current source 22, and has a first terminal connected to electrical ground and a second terminal connected to the second terminal of the inductor 20. A capacitor 24 has a first terminal connected to electrical ground and a second terminal connected to the second terminal of the inductor 20 and the second terminal of the current source 22. The capacitor 24 represents the power amplifier device capacitance. An RF matching network 26 has a first terminal connected to the second terminal of the inductor 20, the second terminal of the current source 22 and the second terminal of the capacitor 24 representing the device capacitance. A second terminal of the RF matching network 26 is connected to a second terminal of a load resistor 28, which has a first terminal connected to electrical ground.

The inductor 14 represents the inductance of the interconnection between the ideal voltage modulator 12 and the power amplifier as represented by current source 22. The capacitor 18 provides RF decoupling. RF current is drawn from the RF decoupling capacitor 18, and video frequency current is drawn from the ideal voltage modulator 12. Typically the supply feed network for a power amplifier comprises an inductor such as the inductor 20 shown in FIG. 2, or a transmission line typically having an electrical length of up to ¼ wavelength at the RF carrier frequency across which the RF power amplifier voltage is generated. The capacitor 24 represents the device capacitance of the ideal RF transistor represented by current source 22.

The load impedance presented to the ideal voltage modulator 12 shows two series (low impedance) resonances. This can be further understood with reference to FIGS. 3(a) and 3(b).

Figure 3:
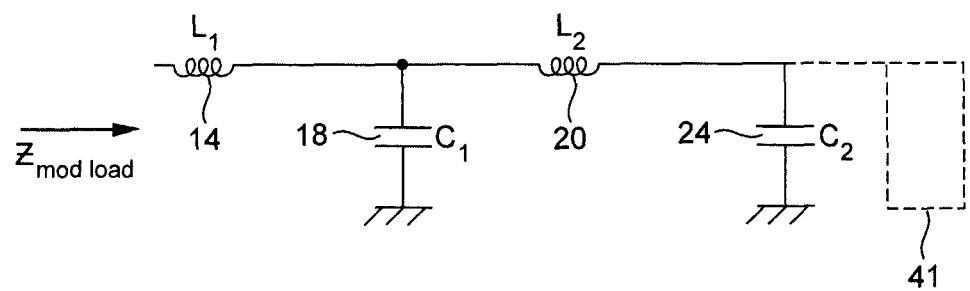
FIGS. 3(a) and 3(b) illustrate an architecture and a plot of modulated load impedance in accordance with the prior art.
Figure 3:
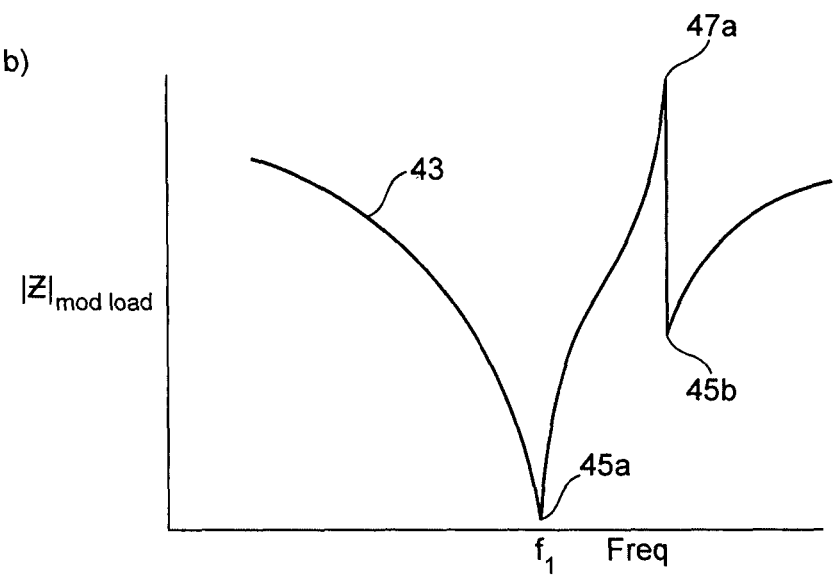

With reference to FIG. 3(a), there is illustrated a section of the model of FIG. 2 showing the components which influence the load impedance presented to the ideal voltage modulator 12 referred to as the modulator load impedance and denoted $Z_{mod\_load}$. This modulator load impedance, $Z_{mod\_load}$ is that seen from the output of the ideal voltage modulator 12 looking into the first terminal of the inductor 14. As denoted by reference numeral 41, the ideal power amplifier is represented as an open circuit at the second terminal of the inductor 20. The idealised RF power transistor is replaced by an open circuit as is assumed to have infinite output impedance.

With reference to FIG. 3(b), there is illustrated a plot of the magnitude of the modulator load impedance $Z_{mod\_load}$ against frequency. As can be seen the plotted waveform 43 has minima denoted by reference numerals 45a and 45b. The minima 45a and 45b represent the series resonances associated with the network comprising inductors 14, 20 and capacitors 18, 24. The lowest frequency resonance denoted by minimum 45a, determined primarily by the values of inductor 14 and decoupling capacitor 18, occurs at a frequency f1.

Figure 4:
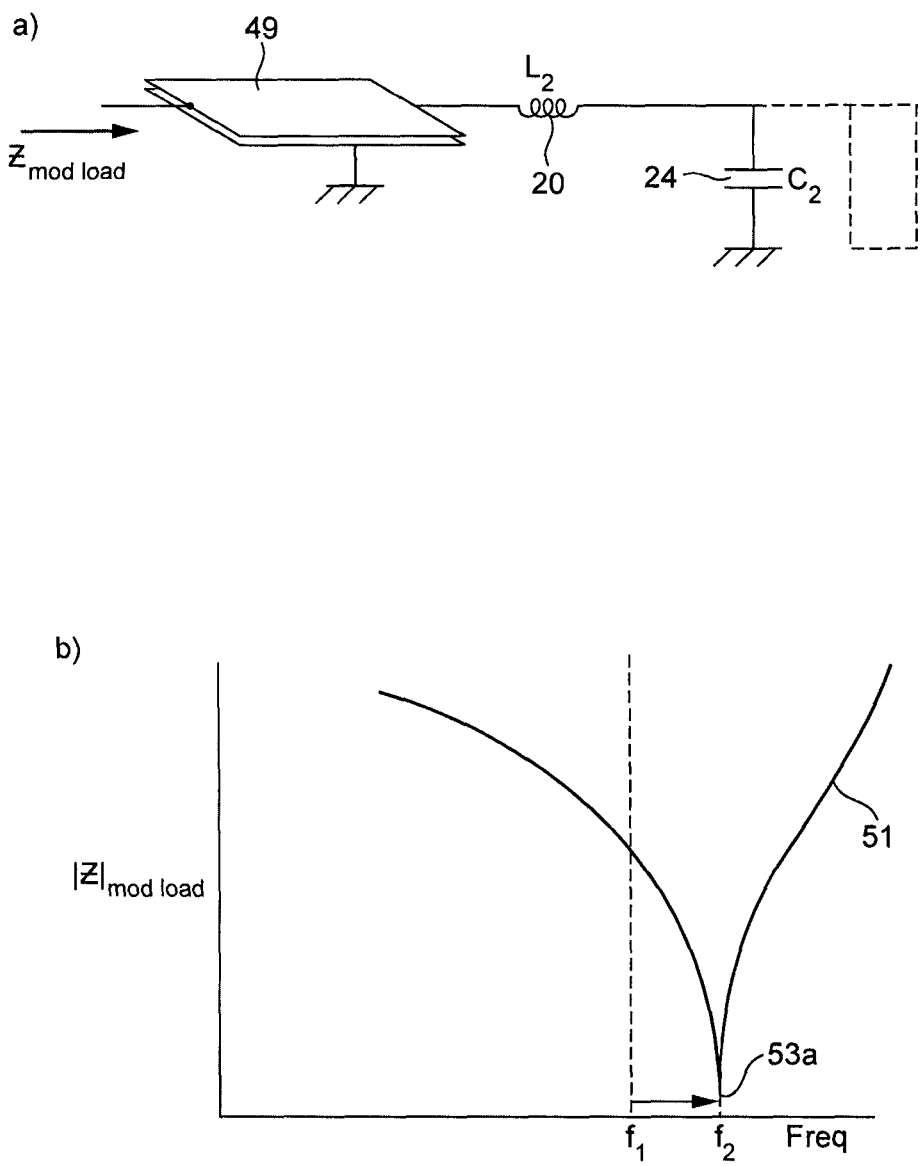
FIGS. 4(a) and 4(b) illustrate an architecture and a plot of modulated load impedance in accordance with an embodiment of the invention.

The invention replaces the connection of the modulator to the power amplifier represented by the inductor 14 with a printed circuit board (PCB) power distribution plane 49. The modification of the arrangement of FIG. 3(a) in accordance with the invention is illustrated in FIG. 4(a). The RF decoupling capacitor 18 of FIG. 3(a) may also be fully or partially replaced by the power distribution plane 49.

The power distribution plane is an ultra-low impedance transmission line.

The power distribution plane 49 may be implemented as a continuous copper layer within a PCB structure, separated from one or more ground planes within the PCB structure by a very thin dielectric layer. As such, the power distribution plane can be considered as a very low impedance transmission line.

With reference to FIG. 4(b), there is illustrated a plot of the magnitude of the modulator load impedance $Z_{mod\_load}$ presented to the ideal voltage modulator 12, against frequency, for the structure shown in FIG. 4(a). As can be seen the plotted waveform 51 has a single minimum denoted by reference numeral 53a. The minimum 53a represents a single low impedance resonance associated with the LC circuit 20, 24.

The resonance can cause stability problems for the supply modulator which would replace the ideal voltage modulator 12 in a real implementation.

The impedance of a transmission line is given by the following equation:

$$Z_O = \sqrt{L/C}$$

Hence a transmission line exhibits low impedance per unit length and high capacitance per unit length. A power distribution plane may be modelled as an ultra-low impedance transmission line. If the capacitance of the power distribution plane is sufficiently large, it may serve as the sole RF decoupling for the power amplifier, and the lumped element decoupling capacitor 18 of FIG. 3(a) may be eliminated. In such case, the resulting load impedance presented to the modulator exhibits only one resonance, and the frequency f2 of the resonance at the minimum 53a is increased compared with the prior art arrangement of FIG. 3(a).

By increasing the frequency of the lowest series resonance, it is possible to substantially increase the maximum stable bandwidth of the supply modulator. This in turn permits a reduction in the output impedance of a real supply modulator implementation and so eases the task of stabilising the RF power amplifier.

Figure 5:
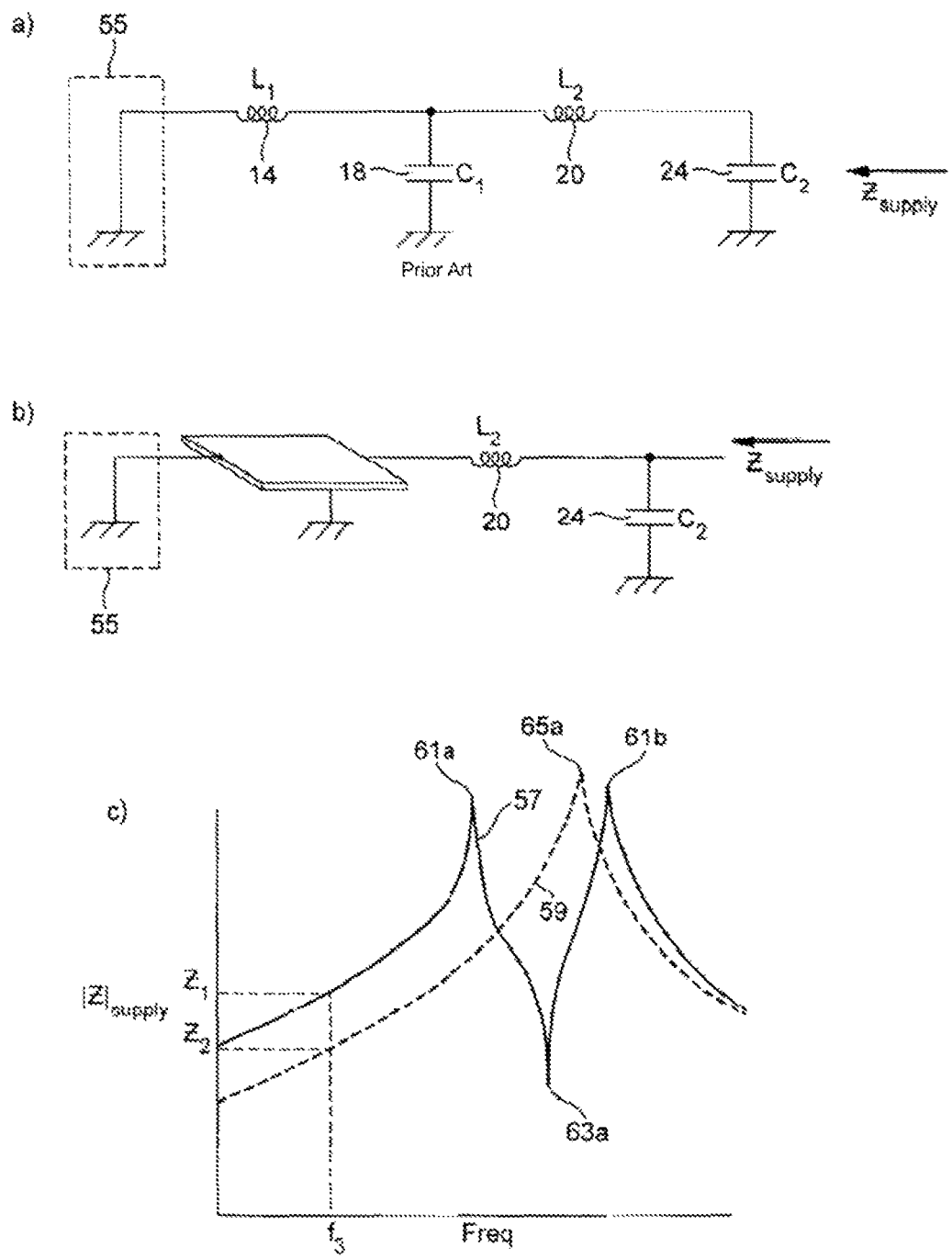
FIG. 5(a) illustrates an architecture in accordance with the prior art.
FIG. 5(b) illustrates an architecture in accordance with an embodiment of the invention.
FIG. 5(c) illustrates a comparison plot of supply impedance.

With reference to FIGS. 5(a) to 5(c) there is discussed a comparison of the supply impedance seen from the intrinsic drain/collector of the power amplifier device for the prior art and an adaptation in accordance with the invention.

The supply impedance $Z_{supply}$ is seen from the intrinsic drain/collector of the device power amplifier looking toward the second terminal of the inductor 20. In both the prior art arrangement of FIG. 5(a) and the inventive embodiment of FIG. 5(b) the idealised supply modulator is assumed to have zero output impedance and is replaced by a short circuit 55 connecting to electrical ground. In the prior art arrangement of FIG. 5(a) the first terminal of the inductor 14 is short-circuited. In the embodiment of the invention illustrated in FIG. 5(b) the power distribution plane is connected to electrical ground by the short circuit 55.

As shown in FIG. 5(c), the impedance $Z_{supply}$ for each of the arrangements of FIGS. 5(a) and 5(b) is plotted against frequency. The solid line plot 57 for the prior art arrangement of FIG. 5(a) has two maxima 61a and 61b, and a minimum 63a. The dashed line plot 59 associated with the inventive embodiment of FIG. 5(b) has a single maximum 65a.

As illustrated in the plots of FIG. 5(c), the supply impedance at low frequencies is significantly decreased. For example at frequency $f_3$ the supply impedance is reduced from $Z_1$ to $Z_2$. The supply impedance also contains only one peak associated with the resonance of inductor and capacitor 20, 22, rather than two parallel (i.e. high impedance) resonances, as denoted by peak 65a. The reduced supply impedance results in reduced voltage error at the power amplifier intrinsic drain/collector, and hence reduced memory effects.

A particularly advantageous implementation of the invention is in an arrangement where a single modulator is used to power several power amplifiers, irrespective of whether the power amplifiers are simultaneously active or not. Multiple narrowband power amplifiers are commonly used in multi-band mobile telecommunication handsets, for example, and it is convenient to use a single modulator to power whichever power amplifier is in use.

Such an architecture is illustrated in FIG. 6(a).

FIG. 6(a) is illustrative of the parasitic elements associated with interconnecting a voltage modulator to multiple power amplifiers. The precise details will, however, depend upon how the interconnecting PCB tracks are routed. The general principle is that feeding multiple power amplifiers from the voltage modulator will result in a reduction in the frequency of the first series resonance, and an increase in the number of higher frequency resonances.

In the exemplary arrangement of FIG. 6(a) three power amplifier arrangements are provided (not shown) having three associated supply feed networks 101a, 101b, 101c each having the same basic structure shown in FIG. 2. Thus each supply feed network 101a, 101b, 101c includes: a capacitor 18a, 18b, 18c respectively; an inductor 20a, 20b, 20c respectively; and a capacitance associated with the power amplifier device, denoted by capacitors 24a, 24b, 24c respectively. All components are replicated by a number of times corresponding to the number of power amplifiers.

Inductor 14 of FIG. 6(a) represents the inductance of the track from the voltage modulator to the power amplifier assembly. This inductance is common to all power amplifiers.

Inductor 61 represents the inductance of the power supply track from the first to the second power amplifier being connected between the second terminal of inductor 14 and the first terminal of inductor 20b. Similarly, inductor 63 represents the inductance associated with the supply feed to the third power amplifier 101c, being connected between the second terminal of inductor 61 and the first terminal of inductor 20b.

Each power amplifier 101a, 101b, 101c typically retains its own RF decoupling capacitor 18a, 18b, 18c.

The solid line 65 of FIG. 6(b) illustrates a plot of the modulator load impedance, $Z_{mod\_load}$, against frequency for the prior art, three power amplifier arrangement of FIG. 6(a). The dashed line 67 illustrates a plot in accordance with a prior art amplifier arrangement with one power amplifier arrangement.

As can be seen in FIG. 6(b), there are four minima 69a, 79b, 69c, 69d associated with the waveform 65. Each power amplifier added reduces the frequency of the lowest series resonance in the load impedance presented to the modulator, thereby compromising the stability and performance of the supply modulator and reducing the operational bandwidth of the arrangement. In FIG. 6(b), it can be seen that the frequency of the lowest series resonance in the load impedance is reduced from $f_5$ to $f_4$ with introduction of the three amplifier arrangement.

Figure 6:
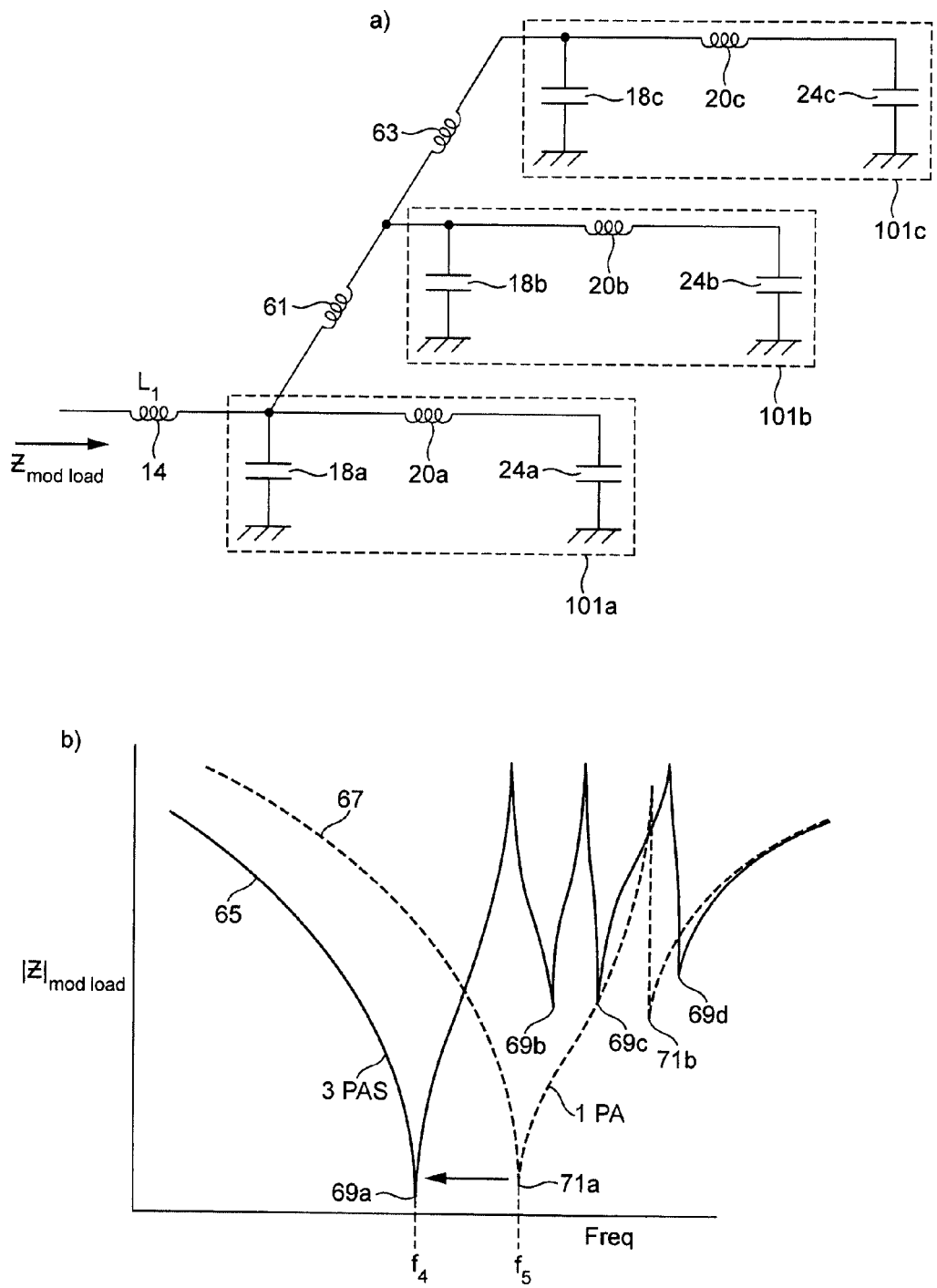
FIGS. 6(a) and 6(b) illustrate a multi-stage architecture and a plot of modulated load impedance in accordance with the prior art.
Figure 7A:
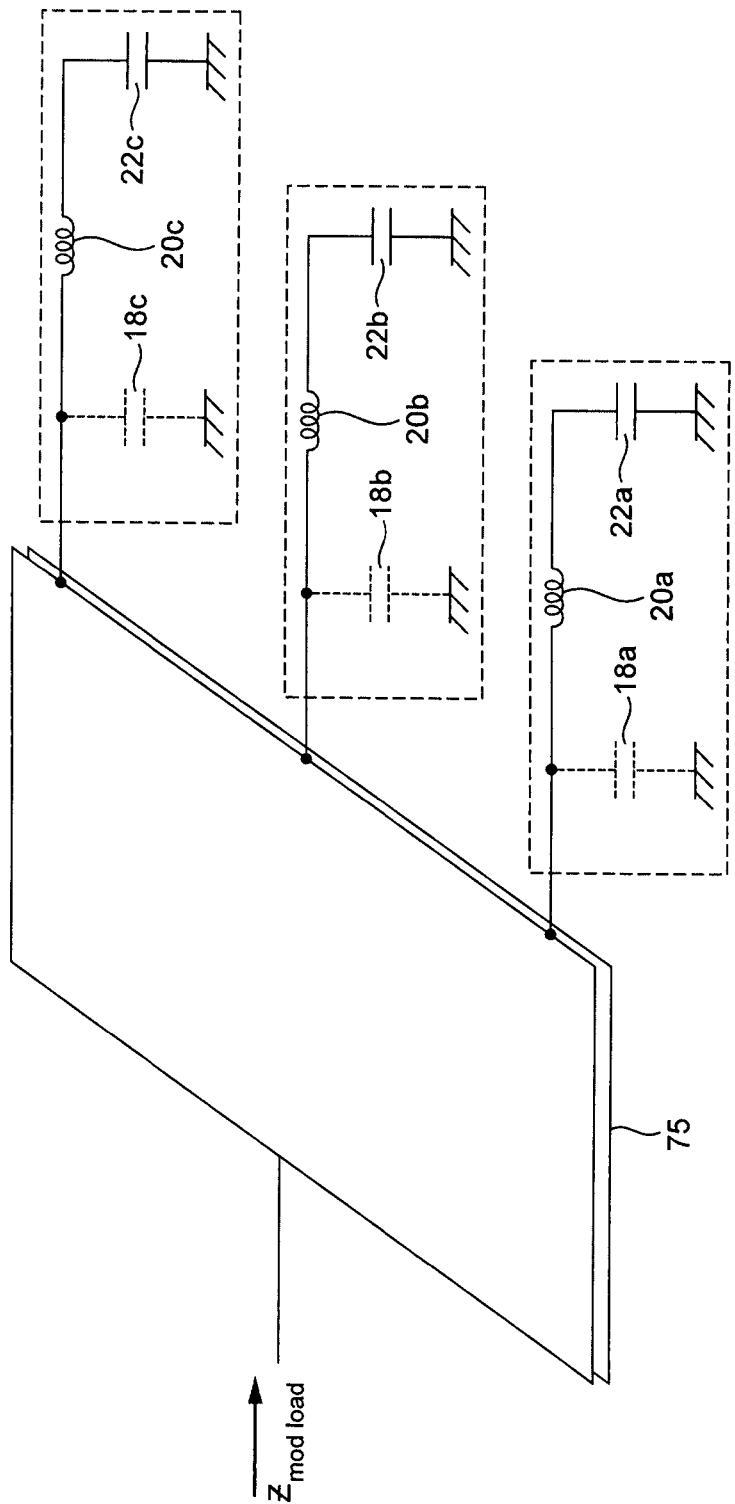
FIGS. 7(a) and 7(b) illustrate a multi-stage architecture and a plot of modulated load impedance in accordance with an embodiment of the present invention.

FIG. 7(a) shows the adaptation of the architecture of FIG. 6(a) in accordance with the present invention in an embodiment. The inductors 14, 61 and 63 are replaced by a power distribution plane 75. The capacitance of the power plane may be used to partially or wholly replace the local RF supply decoupling capacitors 18a, 18b, 18c, and these capacitors may therefore not be required—this is represented by the presence of the capacitors 18a,18b,18c in dashed lines.

Figure 7B:
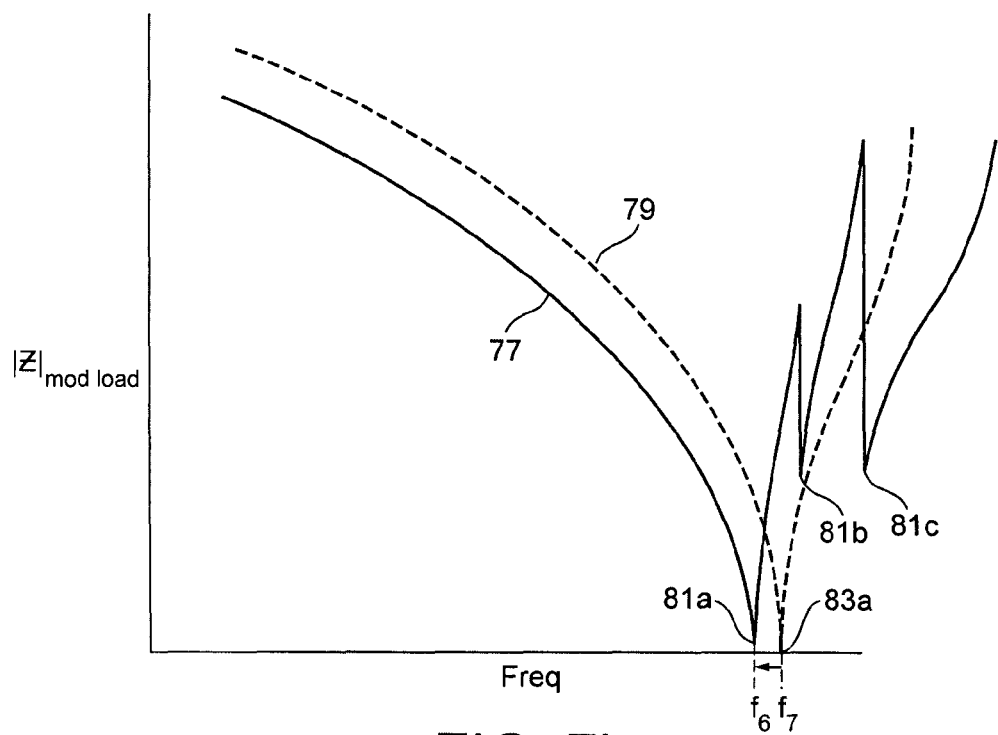

FIG. 7(b) shows an equivalent plot to FIG. 6(b), with solid line waveform 77 showing a plot of impedance against frequency for the architecture of FIG. 7(a) with three power amplifier stages and the power distribution plane, and dashed line plot 79 showing the equivalent plot for one power amplifier stage with the power distribution plane.

The waveform 77 has three minima 81a, 81b, 81c, compared to the single minima of the waveform 79. The frequency $f_7$ of the resonance with one power amplifier module, as represented by minima 83a, is much higher than the corresponding resonance for the prior art arrangement of FIG. 6(b) as represented by minima 71a. In addition the reduction in resonant frequency as power amplifier modules are added is also much less. As can be seen in FIG. 7, the first frequency at which resonance occurs is reduced only slightly from frequency $f_7$ representing minima 83a to frequency $f_6$ representing frequency 81a in FIG. 7(b).

Figure 8:
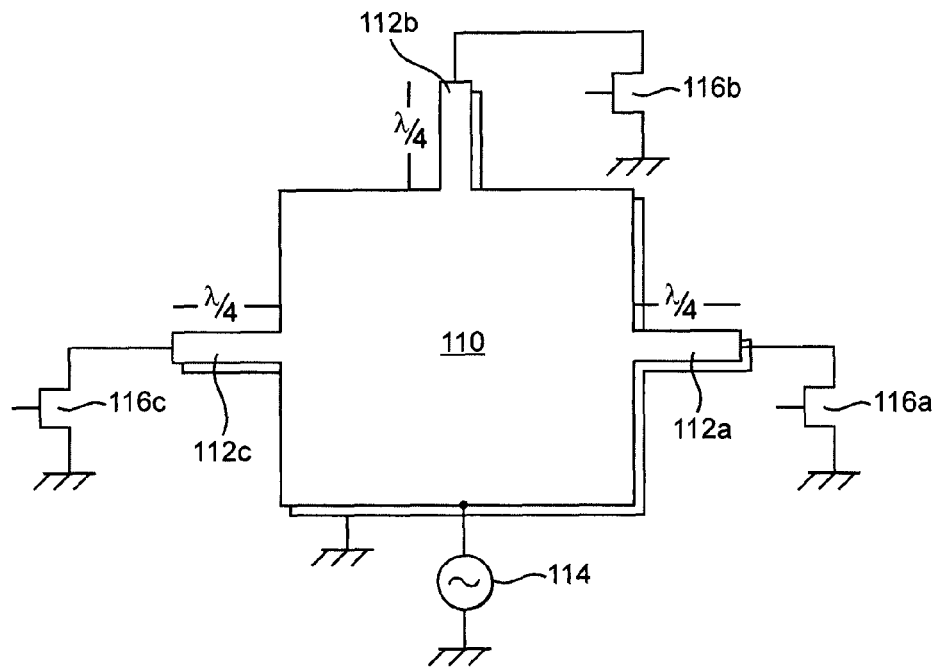
FIG. 8 illustrates a configuration of a power plane in accordance with an embodiment of the invention.

With reference to FIG. 8 there is illustrated the extension of the power distribution plane to implement individual quarter wave RF feed-lines for multiple power amplifiers. Such an arrangement eliminates the discrete inductors 20a, 20*b*, 20*c* of FIG. 7(*a*) and may partially or wholly replace the local RF supply decoupling capacitors 18*a*, 18*b* and 18*c* of FIG. 7(*a*).

As such, the main body of the power plane 110 serves as RF decoupling for the individual power amplifiers, and also allows the power amplifiers and the modulator to be physically separated whilst maintaining extremely low feed-line series inductance.

In the example shown in FIG. 8, an ideal voltage (supply) modulator 114 is connected to one side of the four-sided power plane. The other four sides of the power plane are provided with protrusions 112*a*, 112*b*, 112*c* having lengths of one quarter of the wavelength of the RF carrier frequency, and each is connected to a respective power amplifier 116*a*, 116*b*, 116*c*.

The physical shape of the power distribution plane shown in FIG. 8 is exemplary, and does not represent a limitation on the scope of the invention. The power distribution plane is required to be substantially continuous, i.e. without too many gaps, but is not required to have a particular shape.

The implementation of FIG. 8 is particularly advantageous for multiple-in, multiple-out (MIMO) applications in which a single modulator is used to drive multiple power amplifiers. The invention is described herein with reference to an example of an application to an envelope tracking RF power amplifier. The invention may be advantageously implemented in any apparatus utilising such an arrangement. Envelope tracking power amplifiers are well-known in the art. The instantaneous envelope of the input signal to be amplified is used to generate an appropriate voltage supply level for that instant. In a known envelope tracking power supply, a power supply selects one of a plurality of available supply voltages dependent upon the input signal level. The selected power supply voltage is then adjusted or corrected before being delivered to the power amplifier as a modulated supply voltage.

Figure 9:
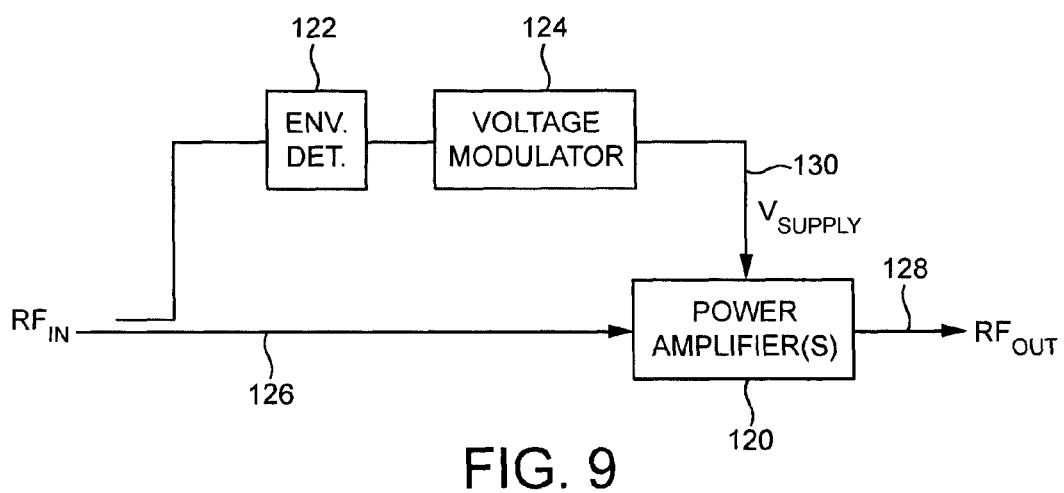
FIG. 9 illustrates an exemplary envelope tracking power amplifier architecture.

With reference to FIG. 9 there is illustrated a basic architecture of an envelope tracking power amplifier. An RF input signal to be amplified is provided on a signal line 126 which is connected to the input of a power amplifier or power amplifiers block 120. An envelope detector 122 receives an input from the RF input signal on line 126, and generates an envelope based on the input signal to a voltage modulator 124. The voltage modulator 124 generates a modulated supply voltage, such as an envelope tracking power supply voltage, on line 130 to the power amplifier or power amplifiers 120. The power amplifier or power amplifiers 120 generate an amplified RF output signal on line 128. The power amplifier or power amplifiers 120 may include a single power amplifier, or multiple power amplifiers as shown in the arrangement of FIG. 6(*a*) or FIG. 7. In a circuit implementation, the power distribution plane of the present invention is provided to transmit the output of the voltage modulator 124 to the power amplifier or power amplifiers 120.

The invention is described herein with reference to an example of an application to an envelope tracking RF power amplifier. The invention may be advantageously implemented in any apparatus utilising such an arrangement.

Exemplary applications of the invention include, but are not limited to: cellular handsets; wireless local area networks; wireless infrastructure; radio and television broadcast transmitters; and military power amplifier applications, from HF (high frequency) to microwave frequency ranges of operation.

The invention is described herein with reference to particular examples and embodiments. One skilled in the art will appreciate that the invention is not limited to the details with which these examples and embodiments are described, the scope of the invention being defined by the appended claims.

What is claimed is:

1. A supply feed network for an envelope tracking power amplifier arrangement comprising a power amplifier and a voltage modulator for providing a supply voltage to the power amplifier, the supply feed network comprising:
   a power distribution plane arranged to connect the supply voltage from the voltage modulator to the power amplifier, in which the power amplifier is a radio frequency (RF) power amplifier for amplifying an RF carrier signal, the supply feed network further comprising an RF de-coupling capacitor with a first and second terminal, wherein the first terminal is connected to the power distribution plane and the second terminal is directly connected to electrical ground.

2. The supply feed network of claim 1 further comprising an inductor, wherein the power distribution plane is connected to one side of the inductor and a power transistor is connected to another side of the inductor such that the supply voltage is provided to the power amplifier via the power distribution plane and the inductor, wherein the capacitance of the power transistor forms a resonant circuit with the inductor.

3. The supply feed network of claim 1 further comprising a transmission line, wherein the power distribution plane is connected to one side of the transmission line and a power transistor is connected to another side of the transmission line such that the supply voltage is provided to the power amplifier via the power distribution plane and the transmission line.

4. The supply feed network of claim 3 in which the power distribution plane is arranged to provide the transmission line.

5. The supply feed network of claim 1 further adapted to connect the supply voltage from the voltage modulator to a plurality of power amplifiers.

6. The supply feed network of claim 5 further comprising a plurality of inductors, wherein the power distribution plane is connected to one side of each of the inductors and each power transistor is connected to another side of each of the inductors such that the supply voltage is provided to the plurality of power amplifiers via the power distribution plane and the inductors, wherein the capacitance of each power transistor forms a resonant circuit with each inductor.

7. The supply feed network of claim 5 further comprising:
   a plurality of transmission lines, wherein the power distribution plane is connected to one side of each transmission line and a respective power transistor is connected to another side of each respective transmission line such that the supply voltage is provided to the power amplifiers via the power distribution plane and the respective transmission lines.

8. The supply feed network of claim 7 in which the power distribution plane is arranged to provide each of the transmission lines.

9. A supply feed network for an envelope tracking power amplifier arrangement comprising a power amplifier and a voltage modulator for providing a supply voltage to the power amplifier, the supply feed network comprising:
   a power distribution plane arranged to connect the supply voltage from the voltage modulator to the power amplifier, in which the power amplifiers comprise multiple radio frequency (RF) power amplifiers for amplifying an RF carrier signal, the supply feed network further comprising a plurality of RF de-coupling capacitors each associated with a respective power amplifier, wherein each of the plurality of RF de-coupling capacitors has a first and second terminal, wherein each of the first terminals is connected to the power distribution plane and each of the second terminals is directly connected to electrical ground.

10. The supply feed network of claim 1 wherein the frequency at which a minimum impedance resonance occurs in the impedance presented to the voltage modulator by the power amplifier is increased, thereby allowing an increase in the stable bandwidth of the voltage modulator.

* * * * *